(12) United States Patent
Pupalaikis et al.

(10) Patent No.: US 8,706,433 B2
(45) Date of Patent: Apr. 22, 2014

(54) TIME DOMAIN REFLECTOMETRY STEP TO S-PARAMETER CONVERSION

(75) Inventors: Peter J Pupalaikis, Ramsey, NJ (US); Kaviyesh Doshi, Emerson, NJ (US); Anirudh Sureka, Mamaroneck, NY (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 441 days.

(21) Appl. No.: 13/017,394

(22) Filed: Jan. 31, 2011

(65) Prior Publication Data

US 2011/0191046 A1 Aug. 4, 2011

Related U.S. Application Data

(60) Provisional application No. 61/300,230, filed on Feb. 1, 2010, provisional application No. 61/300,065, filed on Feb. 1, 2010.

(51) Int. Cl.
*G01R 13/00* (2006.01)

(52) U.S. Cl.
USPC .......................................................... 702/66

(58) Field of Classification Search
USPC ......... 702/60, 65, 66, 69, 74–77, 83, 85, 106, 702/107, 109, 183, 189, 191
See application file for complete search history.

(56) References Cited

U.S. PATENT DOCUMENTS

| | | | |
|---|---|---|---|
| 6,594,604 B2 * | 7/2003 | Metzger et al. | 702/104 |
| 6,998,833 B2 * | 2/2006 | Wang et al. | 324/76.12 |
| 7,088,110 B1 * | 8/2006 | Bois et al. | 324/638 |
| 2004/0162689 A1 * | 8/2004 | Jamneala et al. | 702/104 |

OTHER PUBLICATIONS

"Applying Error Correction to Network Analyzer Measurements", *Agilent AN 1287-3 Application Note*, (2002), 1-16.
Shaarawi, Amr M., et al., "Computing the Complete FFT of a Step-Like Waveform", *IEEE Transactions on Instrumentation and Measurement*, vol. IM-35, No. 1, Mar. 1986, 1-2.
Pupalaikis, Peter J., et al., U.S. Appl. No. 13/017,360, filed Jan. 31, 2011, Entitled: Time Domain Network Analyzer, 1-43.
Pupalaikis, Peter J., et al., U.S. Appl. No. 12/890,832, filed Sep. 27, 2010, Entitled: Wavelet Denoising for Time-Domain Network Analysis, 1-58.
Pupalaikis, Peter J., et al., U.S. Appl. No. 12/418,645, filed Apr. 6, 2009, Entitled: Method for De-Embedding Device Measurements, 1-45.
Khalil, Nadim "VLSI Characterization with Technology Computer-Aided-Design", PhD Thesis, 14 pages, www.iue.tuwien.ac.at/phd/khalil/, (May 1995).
Rautio, James C., "Techniques for Correcting Scattering Parameter Data of an Imperfectly Terminated Multiport when Measured with a Two-Port Network Analyzer", *IEEE Transactions on Microwave Theory and Techniques* vol. MTT-31, No. 5, (May 1983),407-412.

* cited by examiner

*Primary Examiner* — Mohamed Charioui
(74) *Attorney, Agent, or Firm* — Gordon Kessler

(57) ABSTRACT

A method and apparatus are provided for calculating s-parameters of a device under test from step waveforms acquired by a time domain network analyzer.

20 Claims, 6 Drawing Sheets

| Group # | Dut Port connected to pulser | Dut Ports connected to the system ports | Indices of approximate result |
|---|---|---|---|
| 1 | 1 | 1,2 | (1,1), (1,2), (2,1), (2,2) |
|   | 2 | 2,1 |   |
| 2 | 1 | 1,3 | (1,1), (1,3), (3,1), (3,3) |
|   | 3 | 3,1 |   |
| 3 | 2 | 2,3 | (2,2), (2,3), (3,2), (3,3) |
|   | 3 | 3,2 |   |

FIG. 9

TIME DOMAIN REFLECTOMETRY STEP TO S-PARAMETER CONVERSION

CROSS REFERENCE TO RELATED APPLICATIONS

This application claims the benefit of U.S. Provisional Patent Application 61/300,230, filed Feb. 1, 2010 titled "Time Domain Reflectometry Step to S-Parameter Conversion" to Pupalaikis et al.; and U.S. Provisional Patent Application 61/300,065, filed Feb. 1, 2010 titled "Time-Domain Network Analyzer" to Pupalaikis et al., the contents of each of these applications being incorporated herein by reference.

FIELD OF THE INVENTION

The present invention relates to scattering parameters (s-parameters) calculation using measurements made by network analysis instruments in general and specifically to s-parameters calculation using measurements made by network analysis instruments that use time domain methods and more specifically to s-parameters calculations using measurements made by the time domain network analyzer (TDNA) described in copending patent application Ser. No. 13/017,360, filed Jan. 31, 2011, titled Time Domain Network Analyzer or other appropriate apparatus, the entire contents thereof being incorporated herein by reference.

BACKGROUND OF THE INVENTION

Network analyzers are instruments that characterize networks. The characterization result is based on conventions and define how the network will perform under various conditions. In signal integrity applications, the common network parameters in use are s-parameters. S-parameters define port to port relationships in a network when the network is driven by a source whose impedance is set to the reference impedance and all other ports are terminated in that same reference impedance. This convention allows scattering parameters to completely define the behavior of a network under any other driving and termination conditions.

A standard instrument for s-parameter measurement is the vector network analyzer (VNA). This instrument stimulates a network with sinusoidal incident waveforms and measures the reflected sinusoidal waveforms at the network ports, and calculates s-parameters from these measurements. This instrument is most commonly used in the field of microwave analysis.

The VNA needs certain user-defined inputs before it can begin measuring s-parameters. For example it needs the frequency points of interest. Having obtained the user-defined inputs, one needs to calibrate the VNA to eliminate systematic errors in the instrument. If the user-defined inputs change, for example if the user decides to choose different frequency points for s-parameters, then the VNA necessarily needs to be calibrated again. This is an unnecessary time consuming exercise.

There are certain desirable properties of s-parameters that one may expect from certain kinds of networks. For example, one may have the knowledge of whether the network to be analyzed is reciprocal. Frequently the s-parameters measured by the VNA are analyzed in conjunction with other networks using some simulation methods and the user may expect the s-parameters to satisfy some constraints based on the knowledge of the network. During the course of simulation if it is discovered that the constraints are violated, then the network necessarily needs to be remeasured or the s-parameters need to be processed by an external algorithm to satisfy the known constraints. The external algorithms may not be optimal.

Another instrument used for s-parameter measurement uses techniques called time domain reflectometry (TDR) and time domain transmission (TDT) (Here we will use the commonly used acronym TDR to represent both techniques, the name of the instrument itself, and time domain analysis in general). TDR stimulates a network with an incident step, or pulse and measures reflected waveforms at the network ports. The device used to generate step or step-like waveform is referred to as pulser and a device used to measure step or a step-like waveform is referred to as sampler.

Traditional, well known TDR instruments require as many pulsers and samplers as the number of ports in the device under test (DUT). Hence the cost of such instruments increases greatly with the increase in the number of ports in the DUT.

Since the s-parameters are described in frequency domain, the time domain measurements made by the TDR instruments should be converted into frequency domain methods. There are techniques to compute frequency response of a step-like waveform. For example the algorithm described by Shaarawi and Riad in "*Computing the Complete FFT of a Step-like Waveform*" *IEEE Transactions on Instrumentation and Measurement, Vol IM*-35, *No.* 1, March 1986 the entire contents thereof being incorporated herein by reference, presents such a technique. Such methods result in incorrect results if the measured step-like waveforms differ in delay or amplitude.

What is needed is a method to calculate s-parameters from measurements made with fewer pulsers and samplers. What is also needed is a method that provides measured s-parameters that are robust to changes in step characteristics like the delay or amplitude. What is also needed is a method that does not require repeated calibration if some of the often used user-defined parameters are changed. What is also needed is a method that can satisfy one or more user-defined constraints at the time of measurements.

OBJECTS OF THE INVENTION

It is an object of this invention to provide methods to calculate s-parameters from step measurements, that remedies the drawbacks listed above.

It is a further object of this invention to provide methods and apparatuses to calculate s-parameters from step measurements obtained using a TDNA or other appropriate apparatus, including the apparatus described in the copending patent application Ser. No. 13/017,360, filed Jan. 31, 2011, titled Time Domain Network Analyzer.

Still other objects and advantages of the invention will in part be obvious and will in part be apparent from the specification and drawings.

SUMMARY OF THE INVENTION

FIG. 1 is an illustrative example that is used as a context for summarizing the present invention. FIG. 1 describes a setup where a d-port DUT [5] is preferably connected to the TDNA [3] described in the copending patent application Ser. No. 13/017,360, filed Jan. 31, 2011, titled Time Domain Network Analyzer. It is desired to measure the s-parameters of the DUT [5], by applying step inputs to the system and measuring the reflected step waveforms. As described in the copending patent application Ser. No. 13/017,360, filed Jan. 31, 2011, titled Time Domain Network Analyzer, $ps_1$ [1] depicts a pulser-sampler, which is a pulser and a sampler. The pulser-sampler [1] may apply a step-like input and measure the reflections from the fixture [4] port marked one. The fixture [4] port connected to the pulser-sampler [1] is referred to as the driven port when the pulser is applying the input pulse. $S_2$ [2] is a sampler that can measure the step-like waveform from port two of the fixture [4]. For the case when there are more than one pulsers, the ports that are not driven are referred to as un-driven ports. In this example, the fixture [4] port connected to the other sampler [2] is the un-driven port. The steps measured at the driven port may be referred to as the TDR steps and the steps measured at the un-driven port may be referred to as the TDT steps. The ports connected to pulsers and samplers together are referred to as the system ports. In this example, the fixture [4] is a (d+2)-port circuit element constructed in accordance with an embodiment of the invention described in copending patent application Ser. No. 13/017,360, filed Jan. 31, 2011, titled Time Domain Network Analyzer, consisting of cables, switches, calibration standards and terminations. In accordance with the invention, such cables and switches of the fixture may be arranged such that a user is able to connect the pulser-sampler [1] port to any one of the DUT [5] ports and the sampler port to any one of the DUT [5] ports.

As described in the copending patent application Ser. No. 13/017,360, filed Jan. 31, 2011, titled Time Domain Network Analyzer, the switches in the fixtures are set automatically and sequentially according to the sequence table, and step measurements are saved. At the end of the sequence one has various step measurements that correspond to the case when the driven port and the un-driven port are connected to the calibration standards used and various step measurements that correspond to the case when the driven port and the un-driven port are connected to different DUT ports. FIG. 2 illustrates an exemplary algorithm used in converting the TDR/TDT steps to s-parameters of the DUT. As shown in FIG. 2, the algorithm requires certain user-defined parameters [8]. For example, the user can supply the number of frequency points and end frequency of the DUT s-parameter result, or additionally the user can enforce certain properties like reciprocity, causality and/or passivity on the calculated DUT s-parameters [16].

The steps measured when the system ports are connected to the calibration standards may be referred to as CAL measurement steps [9] and the steps measured when the system ports are connected to the DUT ports may be referred to as the DUT measurement steps [7]. Each of the CAL measurement step [6] and DUT measurement step [7], will either be a step (for the case when measured port is not the driven port), or a step followed by another step change (for the case when measured port is the driven port). If the port is a driven port, one would like to separate the incident step from the reflected step. Once the incident step is determined it may be removed from the measured waveform to obtain the reflected step. Since one may be interested in calculating the frequency response, one may calculate the first difference of the measured waveform. For an incident step, this would correspond to the impulse that was input to the system. For the waveform measured at the un-driven port, the first difference of the signal would correspond to the through impulse response. Similarly when the incident impulse is extracted from the first difference of the waveform that was measured at the driven port, the waveform would correspond to the reflected impulse response. Once the time domain impulse response is determined, one may take the chirp z-transform (CZT) to obtain the raw frequency responses—incident response, reflected response and the through frequency response. Raw measured CAL s-parameters [9] are obtained from the calibration step measurements by dividing the reflected and through response by the incident response and raw measured DUT s-parameters [10] are obtained from the DUT measurements by dividing the reflected and through response by the incident response. The CZT is well known to those skilled in the art of signal processing.

The fixture s-parameters [11] may be measured ahead of time and are integral to the accuracy of the instrument. They are generally measured using a high-accuracy vector network analyzer at the factory. Preferably, they are measured at very fine frequency steps up to and including the highest frequency of the instrument. As an example, one could measure 8001 frequency points from 0 to 40 GHz for a 40 GHz measurement. At the time of use, the fixture S-parameters must be re-sampled onto the same frequency scale that the instrument user has requested. In one type of operation, the user may be purposely restricted from using points that require interpolation of the fixture S-parameters. This may be done by restricting the user to combinations of the prime factors of the number of frequency points utilized to measure the fixtures at the factory. For example, if the user had selected 20 GHz as the end frequency in the aforementioned example, the unit would restrict him to numbers like 4000, 2000, 1000, 500, 100, 200, etc.—all numbers that divide into the 8000 frequency points using an integer divisor. This allows the fixture S-parameters to be resampled through simple decimation. In other words, if 2001 points were requested (at 20 GHz), one may simply pick every other frequency sample in the fixture S-parameters provided. Otherwise, the user is able to pick any number of points, provided it is within the frequency range of calibration. This may be accomplished by calculating the inverse discrete Fourier transform (IDFT) of the fixture S-parameters, preferably using only the points up to the end frequency provided and then calculating the Chirp Z-transform (CZT) of the time sequence utilizing an arc on the unit circle representing the frequency points that the user has requested. The IDFT is well known to those skilled in the art of signal processing. These fixture S-parameters, once re-sampled, may preferably be cached on the disk or other storage medium so that recalculation of the re-sampled data, which can be time consuming, does not need to be repeated.

The raw measured calibration s-parameters [9] calculated from the calibration steps [6] in conjunction with the fixture S-parameters [11] representing the calibration standards, may be used to generate what is referred to as the error terms [12]. These error terms are the s-parameter representation of the network model used to model the systematic errors. For example, the most commonly used twelve-term error model, as described in *Agilent AN* 1287-3 *Applying Error Correction to Network Analyzer Measurements—Application Note* the entire contents thereof being incorporated herein by reference, may be used. The raw measured DUT s-parameters [10] calculated from the DUT measurement steps [7], in conjunction with the error terms [12] and the fixture s-parameters [11] representing the DUT connections may be used to calculate the DUT s-parameters using the algorithm as will be described below. The block shown as Solver [13] (see FIG. 2) represents this algorithm. If any of the input parameters change, then the action/calculation that use those input parameters necessarily need to be performed again. Since the acquisition of the steps don't depend on any of these parameters, once acquired, they can be stored and re-used for any configuration of the input parameters. The approach thus provides robustness to the method of calculating the results, as well as a debugging option to troubleshoot problems if any.

The output of the solver [13] comprises a raw DUT s-parameter result [14], which depending on the input parameters may be further processed to enforce certain characteristics.

For example, if the DUT is connected using cables and adapters, and if the s-parameters of these cables and adapters are known [15], then they can be de-embedded from the calculated result to obtain the DUT s-parameters [16].

Thus as described in the copending patent application Ser. No. 13/017,360, filed Jan. 31,2011, titled Time Domain Network Analyzer, a network analyzer for the present invention may preferably comprise:

One or more pulsers and two or more samplers.

A control system to apply an input signal through any desired pulser and to measure the reflected waveforms by the sampler.

Fixtures consisting of switches, internal calibration standards, terminations and cables connecting them.

A control to set the switches in a desired configuration.

A software medium that stores the s-parameters of fixtures under different conditions.

A system that consumes the measurements made by the pulsers and samplers, and the stored fixture s-parameters and calculates the s-parameters of the DUT as described in this patent.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which:

FIG. 9 is a table depicting grouping of ports of a DUT in accordance with an embodiment of the invention.

DETAILED DESCRIPTION OF THE PREFERRED EMBODIMENTS

A detailed description of the invention will now be provided, making reference to the following drawings in which like reference numbers designate similar structure or steps.

Figure 1:
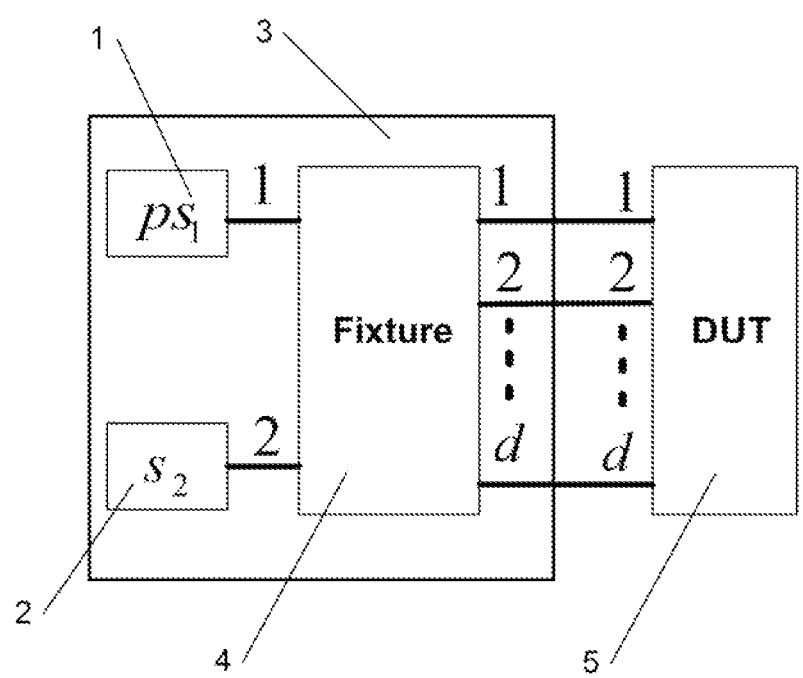
FIG. 1 is a block diagram of the system used to measure the s-parameters of the DUT from step measurements made using the time domain network analyzer with one pulser and two samplers in accordance with an embodiment of the invention.
Figure 2:
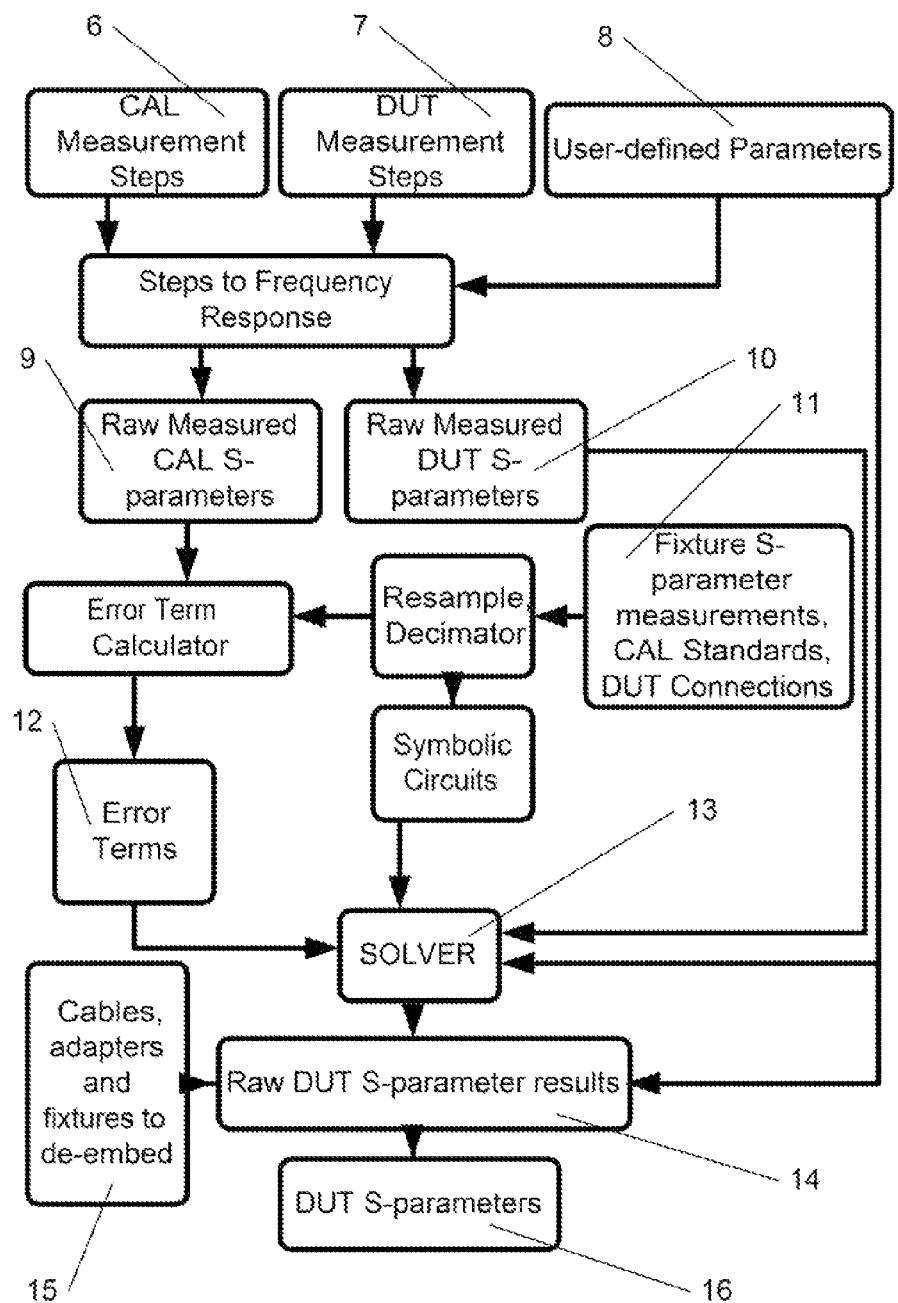
FIG. 2 is a flow chart indicating the algorithm to calculate s-parameters from the step measurements in accordance with an embodiment of the invention.
Figure 3:
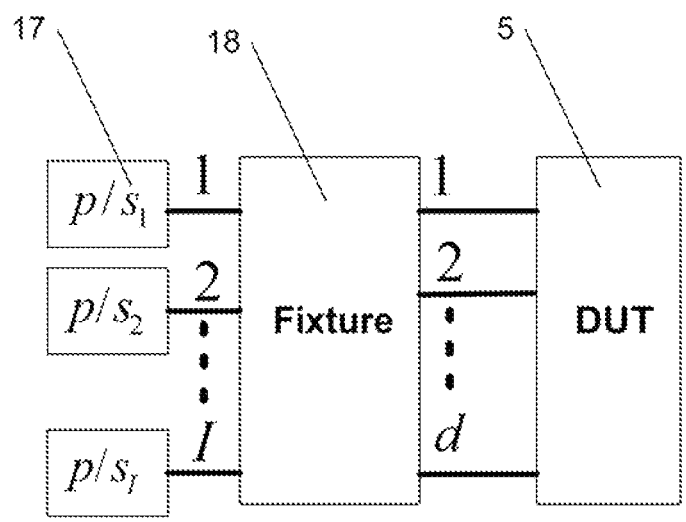
FIG. 3 is a block diagram of an ideal system used to measure the s-parameters of the DUT from step measurements made using one or more ideal pulsers and two or more ideal samplers in accordance with an embodiment of the invention.

FIG. 3 illustrates a setup where a d-port DUT [5] is connected to the TDNA described in the copending patent application Ser. No. 13/017,360, filed Jan. 31, 2011, titled Time Domain Network Analyzer. Other appropriate apparatuses may also be employed. It is desired to measure the s-parameters of the DUT [5], by preferably applying step inputs to the system and measuring the reflected step waveforms. $p/s_f$ [17] is a sampler, which may also have a pulser. Thus the system may have I($\geq$2) samplers and one or more (maximum of I pulsers). In this example, the fixture [18] is a (I+d)-port circuit element constructed in accordance with an embodiment of the invention (in copending patent application Ser. No. 13/017,360, filed Jan. 31, 2011, titled Time Domain Network Analyzer) preferably consisting of cables, switches, calibration standards and terminations. In accordance with one or more embodiments of the invention, such cables and switches of the fixture may be arranged such that a user is able to connect a driven port to any one of the DUT [5] ports and the system ports to one or more of the DUT [5] ports.

Through a switch control system, the fixture switches may preferably be set to a plurality of desired positions automatically and sequentially, thus providing different paths between the system ports and the DUT ports. Therefore, in accordance with such a system in accordance with the present invention, the steps of:

setting the fixture to a particular configuration, applying a step-like input to any one of the DUT ports, and measuring the response (reflected waves) of the system at the system ports may be defined as a measurement condition. Thus, in accordance with an embodiment of the invention, the system may automatically and sequentially define multiple independent measurement conditions by using different fixture configurations. Reflected waves at the system ports may be measured under independent measurement conditions to determine the DUT s-parameters.

Figure 4:
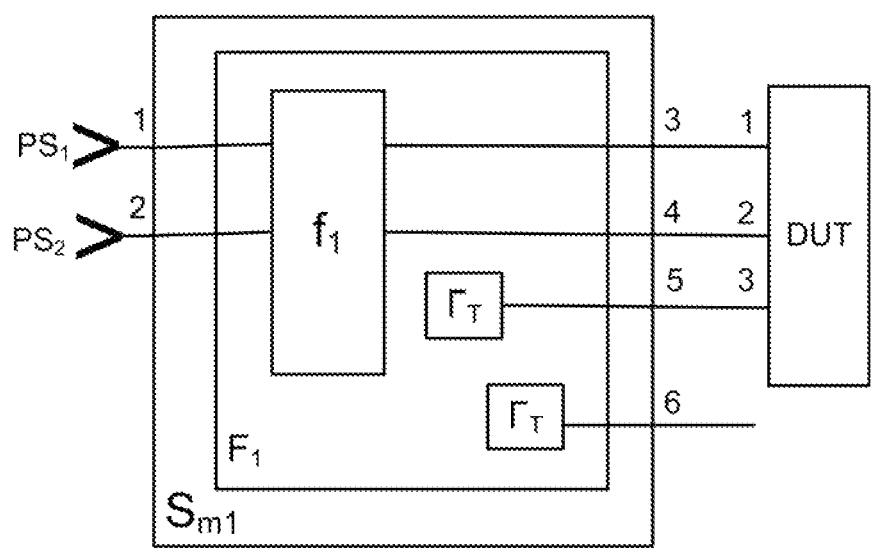
FIG. 4 is a block diagram for measurement conditions one and two for measuring the s-parameters of a three port DUT using a TDNA with two pulsers and two samplers in accordance with an embodiment of the invention.
Figure 5:
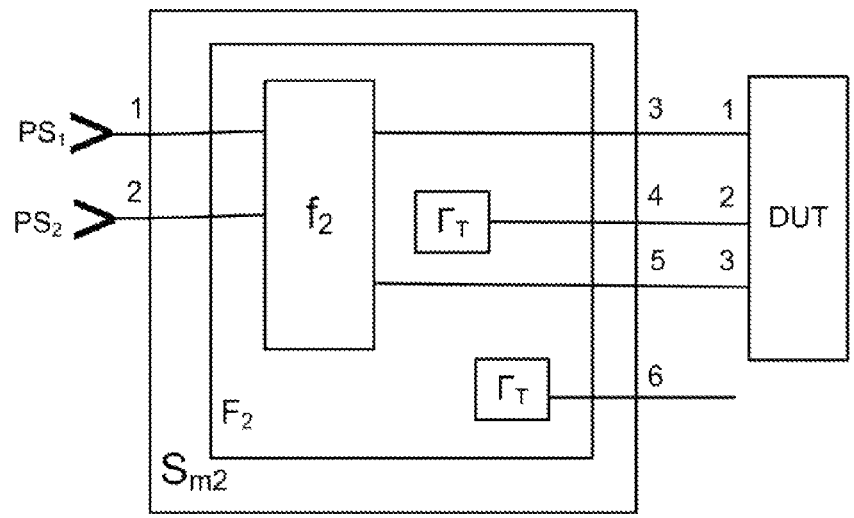
FIG. 5 is a block diagram for measurement conditions three and four for measuring the s-parameters of a three port DUT using a TDNA with two pulsers and two samplers in accordance with an embodiment of the invention.
Figure 6:
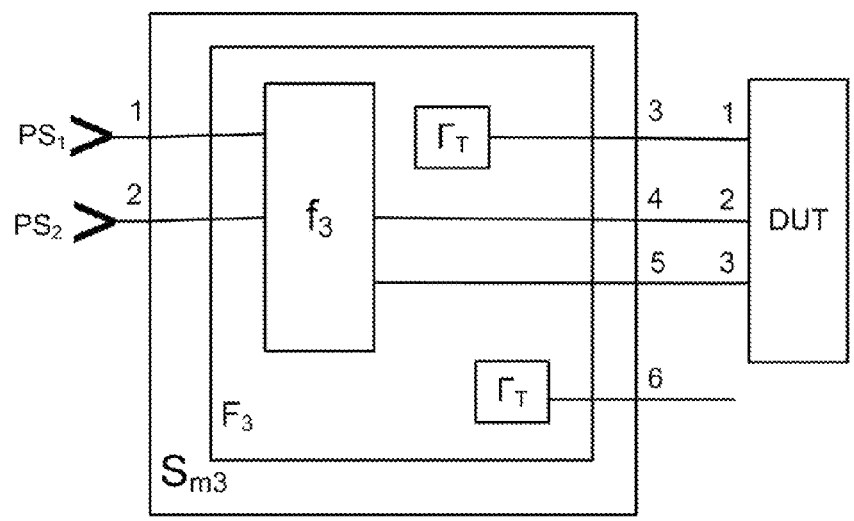
FIG. 6 is a block diagram for measurement conditions five and six for measuring the s-parameters of a three port DUT using a TDNA with two pulsers and two samplers in accordance with an embodiment of the invention.

A number of independent measurement conditions depend on the number of pulsers, samplers, and number of ports in the DUT, determined beforehand and may be stored in the form of sequence table. Such a table is described in the copending patent application Ser. No. 13/017,360, filed Jan. 31, 2011, titled Time Domain Network Analyzer. For example for a three port DUT connected to a TDNA with two pulsers and two samplers may have six DUT measurement conditions, FIG. 4 depicts the first two measurement conditions. As is shown, $PS_1$ and $PS_2$, comprising the two pulser-samplers, F1, comprising a six port fixture with known s-parameters, i.e. s-parameters of $f_1$ and $\Gamma_T$ are known. As is shown, port three of the DUT is terminated in a known termination $\Gamma_T$. The fixture may be selectively switched so that $PS_1$ is connected to port one of the DUT and $PS_2$ is connected to port two of the DUT. For measurement condition one, port one of the TDNA (and hence port one of the DUT) is driven and the step reflected from DUT port one and the step transmitted through the DUT port two are measured at the system ports. Next port two of the TDNA (and hence port two of the DUT) is driven and the step reflected from DUT port two and the step transmitted through the DUT port one are measured at the system ports. FIG. 5 depicts the third and the fourth measurement conditions where the fixture is switched so that $PS_1$ is connected to port one of the DUT and $PS_2$ is connected to port three of the DUT and port two of the DUT is terminated with a known termination $\Gamma_T$. Next port one of the TDNA (and hence port one of the DUT) is driven and the step reflected from DUT port one and the step transmitted through the DUT port three are measured at the system ports. Next port two of the TDNA (and hence port three of the DUT) is driven and the step reflected from DUT port three and the step transmitted through the DUT port one are measured at the system ports. FIG. 6 depicts the fifth and the sixth measurement condition where the fixture is switched so that $PS_1$ is connected to port two of the DUT and $PS_2$ is connected to port three of the DUT and port one of the DUT is terminated with a known termination $\Gamma_T$. Next port one of the TDNA (and hence port two of the DUT) is driven and the step reflected from DUT port two and the step transmitted through the DUT port three are measured at the system ports. Next port two of the TDNA (and hence port three of the DUT) is driven and the step reflected from DUT port three and the step transmitted through the DUT port two are measured at the system ports.

The fixtures shown for the measurement conditions preferably have two separate characteristics, i.e. there are separate fixtures for terminations and separate for the DUT connections. This does not have to be the case, as long as the switches are switched as described above, and the six port s-parameters are measured beforehand (as described in the copending patent application Ser. No. 13/017,360, filed Jan. 31, 2011, titled Time Domain Network Analyzer).

Once the steps corresponding to calibration and DUT measurements under different conditions are measured, each of the CAL or DUT measurement steps may be first denoised using the algorithm described in the patent application Ser. No. 12/890,832, filed Sept. 27, 2010, titled Wavelet denoising for time-domain network analysis), and will be referred to as the denoised CAL measurement step or denoised DUT measurement step respectively.

Each of the denoised CAL or denoised DUT measurement steps, will preferably either be a step (for the case when measured port is not the driven port), or a step followed by another step change (for the case when measured port is the driven port). If the port is a driven port, the incident step is separated from the reflected step. The incident step may be found by first finding the edge location ¼-th way between the minimum and the maximum value from the left. Once this edge location is found (which is coarse), it may be refined by finding the edge halfway between the coarse edge location minus an input parameter called the side length to the coarse edge location plus the side-length. This calculation of the edge location should handle all cases of edge finding in an input waveform as long as any noise is not greater than ¼-th the step size before the occurrence of the step. Once this edge location is found, the incident waveform may be found from the refined edge time minus the side-length to the refined edge location plus an input parameter called the incident length. The incident length and the side length may be determined from certain characteristics like rise time of the pulser. Once the incident step is determined it may be removed from the measured waveform to obtain the reflected step. Since one may be interested in calculating the frequency response, the first difference of the measured waveform may preferably be formed. For an incident step, this would correspond to the impulse that was input to the system. The first difference of a signal s(n) is denoted as d(n) and may be defined as $$d(n) = \begin{cases} s(0) & \text{if } n = 0 \\ s(n) - s(n-1) & \text{if } n > 0 \end{cases} \quad (1)$$

For the waveform measured at the un-driven port, the first difference of the signal would correspond to the through impulse response. Similarly when the incident impulse is extracted from the first difference of the waveform that was measured at the driven port, the waveform would correspond to the reflected impulse response. Once the time domain impulse response is determined, one may take the CZT to obtain the raw frequency responses -incident response, reflected response and the through frequency response. Raw measured s-parameters may be obtained by dividing the reflected and through response by the incident response. The CZT is well known to those skilled in the art of signal processing. The above mentioned approach to calculate the raw measured S-parameters is robust to changes in step characteristics, like delay or amplitude, since any change in the incident step would affect the reflected and transmitted waveform in a similar fashion, thereby nullifying its effects.

Once the raw measured S-parameters are obtained, they may be used in conjunction with the fixture S-parameters to calculate the DUT s-parameters using the algorithm described next.

In accordance with various embodiments of the invention, a description of the case where pulsers and samplers [17] are considered ideal (FIG. 3) will first be described, i.e. a system without any systematic errors is considered. Thereafter, a calibration step that is preferably implemented before use of the system to determine s-parameters will be described below upon the lifting of the supposition of ideal pulsers and samplers. (After the calibration step, the circuit can still be represented as shown in FIG. 3, except that the fixture s-parameter matrix will be different than originally presented with the ideal suppositions in place.)

Since all the time domain measurements have been converted into frequency domain, the algorithm proceeds to calculate the DUT s-parameters for each frequency of interest. The procedure is the same for each frequency. So the notations described below are understood to be for each frequency unless otherwise specified. In order to determine the s-parameters of the DUT from M measurements, the method and system in accordance with the invention first defines an expression that relates the s-parameters of the fixture and the DUT, to that of the system s-parameters. Let S be the DUT s-parameter matrix at a particular frequency of interest and $F_m$ be the fixture [18] s-parameter matrix at the same frequency and for measurement condition m. The s-parameter matrix $F_m$ is measured beforehand. Then S is of size d×d (where d is the number of ports in the DUT [5]) and $F_m$ is of size (d+I)×(d+I) (where I is the number of samplers). Partition the matrix $F_m$ as shown below:

$$F_m = \begin{pmatrix} -F_{m24} & -F_{m21} \\ I \times I & I \times d \\ -F_{m34} & -F_{m31} \\ d \times I & d \times d \end{pmatrix}.$$

Here the size of each sub-matrix is written below, e.g. $F_{m24}$ is of size I×I.

Let $B_{DUTm}$ represent a vector of length d, where each element $b_i$ is a complex number corresponding to amplitude and phase of the reflected wave at port i of the DUT, under measurement condition m. And $A_{DUTm}$ is a vector of length d, where each element $a_i$ is a complex number corresponding to amplitude and phase of the incident wave at port i of the DUT, under measurement condition m. Similarly, $B_{SYSm}$ is a vector of length I, comprising of reflected waves at the I system ports and $A_{SYSm}$ is a vector of length I, comprising of incident waves at the I system ports.

A reflected wave at each port of a device can be written in terms of the waves incident at the device ($a_i$'s) and the device s-parameters. The system of equations for the complete circuit is given as:

$$\underbrace{\begin{pmatrix} I & 0 & -S & 0 \\ F_{m21} & I & 0 & F_{m24} \\ F_{m31} & 0 & I & F_{m34} \\ 0 & 0 & 0 & I \end{pmatrix}}_{A} \cdot \underbrace{\begin{pmatrix} B_{DUTm} \\ B_{SYSm} \\ A_{DUTm} \\ A_{SYSm} \end{pmatrix}}_{x} = \underbrace{\begin{pmatrix} 0 \\ 0 \\ 0 \\ e_m \end{pmatrix}}_{b} \quad (2)$$

Here $e_m$ is a vector of size I×1 with all zeros except a one at the location corresponding to the system port that is driven. Since the steps have been converted into frequency response, an element k of the $B_{SYSm}$ will be the frequency response for the port k under measurement condition m, and hence the input is considered ideal. Performing Gauss elimination gives the L and the U factors of A. Equation (2) can be then written as:

$$\begin{pmatrix} I & 0 & 0 & 0 \\ F_{m21} & I & 0 & 0 \\ F_{m31} & 0 & I & 0 \\ 0 & 0 & 0 & I \end{pmatrix} \cdot \begin{pmatrix} I & 0 & -S & 0 \\ 0 & I & F_{m21}S & F_{m24} \\ 0 & 0 & I+F_{m31}S & F_{m34} \\ 0 & 0 & 0 & I \end{pmatrix} \begin{pmatrix} B_{DUTm} \\ B_{SYSm} \\ A_{DUTm} \\ A_{SYSm} \end{pmatrix} = \begin{pmatrix} 0 \\ 0 \\ 0 \\ e_m \end{pmatrix} \quad (3)$$

Applying $L^{-1}$ on both the sides reduces the above equation which may be simplified to:

$$\begin{pmatrix} I & 0 & -S & 0 \\ 0 & I & F_{m21}S & F_{m24} \\ 0 & 0 & I+F_{m31}S & F_{m34} \\ 0 & 0 & 0 & I \end{pmatrix} \cdot \begin{pmatrix} B_{DUTm} \\ B_{SYSm} \\ A_{DUTm} \\ A_{SYSm} \end{pmatrix} = \begin{pmatrix} 0 \\ 0 \\ 0 \\ e_m \end{pmatrix}, \quad (4)$$

which can be solved using back substitution to obtain the solution.

$$A_{SYS_m} = e_m, \quad (5)$$

$$A_{DUT_m} = (I+F_{m31} \cdot S)^{-1} \cdot (-F_{m34} \cdot A_{SYS_m}), \quad (6)$$

$$B_{SYS_m} = -F_{m21} \cdot S \cdot A_{DUT_m} - F_{m24} \cdot A_{SYS_m}, \quad (7)$$

$$B_{DUT_m} = S \cdot A_{DUT_m}. \quad (8)$$

So, in accordance with embodiments of the invention the inventors have determined that it may be desirable to observe system s-parameters—$B_{SYS_m}$ for M different measurement conditions and solve for DUT s-parameters S by using the system of equations defined above (5-8).

Linear solver for DUT s-parameters: The inventors of the present invention have determined that in general, the system of equations (5-8) cannot be solved in a linear fashion to obtain the DUT s-parameters S. But, as has further been determined by the inventors of the present invention, there exists a linear solution to obtain DUT s-parameters for the following two cases:

when the number of samplers is greater than or equal to the number of DUT ports and the number of measurement conditions is greater than or equal to the number of DUT ports, and when the terminations are ideal reference impedance and the fixture switch isolation is ideal, i.e. if k is the fixture port number to which a DUT port is connected and that DUT port is terminated by the known termination, then the k-th row and k-th column of the fixture matrix should be all zeros.

Putting equation (8) and (5) into equation (7), $$B_{SYSm} = -F_{m21} \cdot B_{DUTm} - F_{m24} \cdot A_{SYSm}, \quad (9)$$

Here matrix $F_{m21}$ is a square or skinny matrix, i.e. a matrix with the number of rows greater than the number of columns, of a size corresponding to the number of samplers by the number of DUT ports. The above equation can be solved for $B_{DUTm}$:

$$B_{DUTm} = -F_{m21}^{-1} \cdot (B_{SYSm} + F_{24} \cdot A_{SYS}). \quad (10)$$

If $F_{m21}$ is skinny, then the above inverse can be replaced by a pseudo-inverse to obtain a least squares solution for $B_{DUTm}$. Equation (6) can now be rearranged to get:

$$(I+F_{m31} \cdot S) \cdot A_{DUTm} = -F_{m34} \cdot A_{SYSm},$$

$$\Rightarrow A_{DUTm} = -F_{m31} \cdot S \cdot A_{DUTm} - F_{m34} \cdot A_{SYSm},$$

$$\Rightarrow A_{DUTm} = -F_{m31} \cdot B_{DUTm} - F_{m34} \cdot A_{SYSm}, \quad (11)$$

For each measurement condition, in accordance with embodiments of the invention, vectors $B_{DUTm}$ and $A_{DUTm}$ may be calculated from equations (10) and (11), and the column vectors may be concatenated to create matrices $B_{DUT}$ and $A_{DUT}$:

$$B_{DUT} = [B_{DUT1} \; B_{DUT2} \ldots B_{DUTM}] \quad (12)$$

$$A_{DUT} = [A_{DUT1} \; A_{DUT2} \ldots A_{DUTM}] \quad (13)$$

The DUT s-parameters can now be calculated from the expression $$S \cdot A_{DUT} = B_{DUT}, \quad (14)$$

$$S = B_{DUT} \cdot A_{DUT}^{-1}. \quad (15)$$

For the case when the number of measurement conditions is greater than number of DUT ports, $A_{DUT}$ will be a fat matrix, i.e. a matrix with number of rows less than number of columns, and the inverse in equation (15) can be replaced by a pseudo-inverse to obtain a least squares solution for the DUT s-parameters.

Linear solver for reciprocal DUT s-parameters: A reciprocal DUT satisfies the following relationship:

$$S = S^T.$$

Here the T denotes the transpose of the matrix. Equation (14) has $d^2$ unknowns corresponding to the number of s-parameters and d×M equations corresponding to the number of entries in the $B_{DUT}$ matrix. Each of these d×M equations can be written by expanding the matrix equation (14). For example, the equation corresponding to the (i,j) entry in the B matrix is given as:

$$\sum_{k=1}^{d} S_{ik} A_{DUTkj} = B_{DUTij}. \quad (16)$$

For a reciprocal DUT the number of unknowns reduce to $$\frac{d \cdot (d+1)}{2}.$$

If one denotes all the elements on the diagonal of S and all the elements in the lower triangular portion of S, i.e. $S_{ij}$ for $i \geq j$, then one can substitute each $S_{ik}$, $i<k$ in equation (16) by $S_{ki}$. Equation (16) can now be re-written as:

$$G \cdot \hat{S}_{vec} = B_{vec}, (0) \tag{17}$$

where $B_{vec}$ is the "vectorized" $B_{DUT}^T$ in equation (14), $\hat{S}_{vec}$ is the "vectorized" diagonal plus lower-triangular portion of S, and G is a coefficient matrix generated using entries of $A_{DUT}$ so that the equation (16) is satisfied for each element of $B_{DUT}$. Here, "vectorized" $B_{DUT}^T$ means taking each column of the matrix $B_{DUT}^T$, and stacking them on top of each other. So if $B_{DUT}$ is of size d×M, then $$B_{vec} = \begin{pmatrix} B_{DUT*1}^T \\ B_{DUT*2}^T \\ \vdots \\ B_{DUT*d}^T \end{pmatrix},$$

where $B_{DUT*k}^T$ is the k-th column of $B_{DUT}^T \cdot S_{vec}$ is formed by using only the diagonal and lower-triangular portion of S.

$$S_{vec} = \begin{pmatrix} S_{1:d,1} \\ S_{2:d,2} \\ \vdots \\ S_{dd} \end{pmatrix},$$

where $$S_{k:d,k} = \begin{pmatrix} S_{k,k} \\ S_{k+1,k} \\ \vdots \\ S_{d,k} \end{pmatrix}.$$

As an example, the matrix G for a two port, reciprocity enforced DUT, and two measurement conditions, is given by:

$$\begin{pmatrix} a_{1,1} & a_{2,1} & 0 \\ a_{1,2} & a_{2,2} & 0 \\ 0 & a_{1,1} & a_{2,1} \\ 0 & a_{1,2} & a_{2,2} \end{pmatrix} \cdot \begin{pmatrix} S_{1,1} \\ S_{2,1} \\ S_{2,2} \end{pmatrix} = \begin{pmatrix} b_{1,1} \\ b_{2,1} \\ b_{1,2} \\ b_{2,2} \end{pmatrix},$$

where $a_{i,j}$ is the (i,j) entry of the matrix $A_{DUT}$, $b_{i,j}$ is the (i,j) entry of the matrix $B_{DUT}$, and $S_{i,j}$ is the (i,j) entry of the matrix S. The above approach may be generalized for d-port DUT and M measurement conditions.

Nonlinear solver for DUT s-parameters: For the system where linear solution is not possible, the inventors of the present invention have determined to use a Levenberg-Marquardt algorithm, such as that described in "Nadim Khalil, VLSI Characterization with Technology Computer-Aided Design-PhD Thesis, Technische Universitat Wien, 1995" to solve the following non-linear optimization problem:

$$\min_S \sum_{m=1}^{M} \|fm_{measured} - f_m(S)\|_2^2. \tag{18}$$

where, $fm_{measured}$ is the measured system s-parameters for measurement condition m and fm(S) is the analytical expression for the system s-parameters given in equations (7) and (6). The analytical expression can be simplified as $$f_m(S) = -F_{m21} \cdot S \cdot (I + F_{m31} \cdot S)^{-1} \cdot (-F_{m34} \cdot A_{SYSm}) - F_{m24} \cdot A_{SYSm}, \tag{19}$$

which for the given system input $A_{SYS_m}$ and a guess for DUT s-parameters generates the system output $B_{SYS_m}$. Through the algorithm, it may be desired to determine an S that minimizes the distance between the analytical expression and the actual measurement. Levenberg-Marquardt optimization algorithm, for each iteration, requires evaluation of two functions:

Evaluation of $f_m(S)$ as a function of current guess for DUT s-parameter.

Partial derivative of the $f_m(S)$ with respect to DUT s-parameters, evaluated at current guess for DUT s-parameters The function $f_m(S)$ is evaluated as shown in equation (19), while the partial derivatives calculation will now be described.

Partial Derivatives: One method of calculating the partial derivatives would be to use the finite difference approximation, i.e.

$$\frac{\partial f_m(S)}{\partial S_{ij}} = \frac{f_m(S + \epsilon \cdot e_i \cdot e_j^T) - f_m(S)}{\epsilon},$$

for a small value of $\epsilon$. Here $e_i$ is a vector of size DUT ports, with all zeros and a one at the i-th location, and $e_j$ is a vector of size DUT ports, with all zeros and a one at the j-th location. But this numerical calculation is costly as it involves extra calculation of matrix inverse. To save on this calculation cost, an analytical expression may be derived for the partial derivatives. For each measurement condition, the expression for partial derivative will be the same. In order to avoid cumbersome notations, the suffix m is dropped from the derivation. Hence equation (19) may be written as:

$$f(S) = -F_{21} \cdot S \cdot (I + F_{31} \cdot S)^{-1} \cdot (-F_{34} \cdot A_{sys}).$$

The analytical expression of partial derivative with respect to an element $S_{ij}$ may be computed by finding the limits shown below:

$$\frac{\partial f(S)}{\partial S_{ij}} = \lim_{\epsilon \to 0} \frac{f_m(S + \epsilon \cdot e_i \cdot e_j^T) - f(S)}{\epsilon}, \tag{20}$$

Equation (19) is used to compute $f(S + \epsilon \cdot e_i \cdot e_j^T)$.

$$f(S + \epsilon \cdot e_i \cdot e_j^T) = -F_{21} \cdot (S + \epsilon \cdot e_i \cdot e_j^T) \cdot (I + F_{31} \cdot (S + \epsilon \cdot e_i \cdot e_j^T))^{-1} \cdot (-F_{34} \cdot A_{SYM}) - F_{24} \cdot A_{SYS} \tag{21}$$

Using Shermann-Morisson formula, the $(I+F_{31} \cdot (S+\epsilon \cdot e_i \cdot e_j^T))^{-1}$ is given by $$(I + F_{31} \cdot (S + \epsilon \cdot e_i \cdot e_j^T))^{-1} =$$

$$(I + F_{31} \cdot S)^{-1} - \frac{(I + F_{31} \cdot S)^{-1} \cdot \epsilon \cdot F_{31} \cdot e_i \cdot e_j^T \cdot (I + F_{31} \cdot S)^{-1}}{1 + \epsilon \cdot e_j^T \cdot (I + F_{31} \cdot S)^{-1} \cdot F_{31} \cdot e_i}.$$

Substituting the above equation in equation (21), $$f(S + \epsilon e_i e_j^T) = F_{21} \cdot (S + \epsilon \cdot e_i \cdot e_j^T) \cdot ((I + F_{31} \cdot S)^{-1} - F_{24}) \cdot A_{SYS} -$$

$$\left[ F_{21} \cdot (S + \epsilon \cdot e_i \cdot e_j^T) \cdot \frac{(I + F_{31} \cdot S)^{-1} \cdot \epsilon \cdot F_{31} \cdot e_i \cdot e_j^T \cdot (I + F_{31} \cdot S)^{-1}}{1 + \epsilon \cdot e_j^T \cdot (I + F_{31} \cdot S)^{-1} \cdot F_{31} \cdot e_i} \cdot F_{34} \right] \cdot A_{SYS}$$

$$= [F_{21} \cdot S \cdot (I + F_{31} \cdot S)^{-1} \cdot F_{34} - F_{24}] \cdot A_{SYS} + \epsilon \cdot F_{21} \cdot e_i \cdot e_j^T \cdot$$

$$(I + F_{31} \cdot S)^{-1} \cdot F_{34} \cdot A_{SYS} -$$

$$\frac{\epsilon \cdot F_{21} \cdot e_i \cdot e_j^T \cdot (I + F_{31} \cdot S)^{-1} \cdot \epsilon \cdot F_{31} \cdot e_i \cdot e_j^T \cdot (I + F_{31} \cdot S)^{-1} \cdot F_{34} \cdot A_{SYS}}{1 + \epsilon \cdot e_j^T \cdot (I + F_{31} \cdot S)^{-1} \cdot F_{31} \cdot e_i} -$$

$$\frac{\epsilon \cdot F_{21} \cdot S \cdot (I + F_{31} \cdot S)^{-1} \cdot F_{31} \cdot e_i \cdot e_j^T \cdot (I + F_{31} \cdot S)^{-1} \cdot F_{34} \cdot A_{SYS}}{1 + \epsilon \cdot e_j^T \cdot (I + F_{31} \cdot S)^{-1} \cdot F_{31} \cdot e_i}$$

$$= f(S) - \epsilon \cdot F_{21} \cdot e_i \cdot e_j^T \cdot A_{DUT} +$$

$$\frac{\epsilon \cdot F_{21} \cdot S \cdot (I + F_{31} \cdot S)^{-1} \cdot F_{31} \cdot e_i \cdot e_j^T \cdot A_{DUT}}{1 + \epsilon \cdot e_j^T \cdot (I + F_{31} \cdot S)^{-1} \cdot F_{31} \cdot e_i} +$$

$$\frac{\epsilon^2 \cdot F_{21} \cdot e_i \cdot e_j^T \cdot (I + F_{31} \cdot S)^{-1} \cdot F_{31} \cdot e_i \cdot e_j^T}{1 + \epsilon \cdot e_j^T \cdot (I + F_{31} \cdot S)^{-1} \cdot F_{31} \cdot e_i}$$

$$\therefore \frac{\partial f(S)}{\partial S_{ij}} = F_{21} \cdot S \cdot (I + F_{31} \cdot S)^{-1} \cdot F_{31} \cdot e_i \cdot e_j^T \cdot A_{DUT} - F_{21} \cdot e_i \cdot e_j^T \cdot A_{DUT}$$

Putting the suffix m back, the partial derivative for each measurement condition is defined as:

$$\therefore \frac{\partial f_m(S)}{\partial S_{ij}} = F_{m21} \cdot [S \cdot (I + F_{m31} \cdot S)^{-1} \cdot F_{m31} - I] \cdot e_i \cdot e_j^T \cdot A_{DUTm}. \quad (22)$$

Comparing equations (19) and (22), one can observe that for each iteration of the optimization algorithm, only one evaluation of the inverse is required.

Symbolic Sub-Circuits: Instead of deriving the equations for $f_m(S)$ and its partial derivative, one can use system description described in U.S. patent application Ser. No. 12/418,645, filed Apr. 6, 2009 to Pupalaikis et al., titled Method for De-embedding Device Measurements, the entire contents thereof being incorporated herein by reference, to solve for the DUT s-parameters using the non-linear algorithm. A system description is essentially a method to describe the circuit. The inventors may preferably modify a format of the traditional system description on two counts:

An additional information about whether the system port is connected to a pulser is preferably provided. In the system description all the system ports are assumed to be connected to a pulser and hence if one were to calculate the s-parameters of the system, then it would always be a square matrix. With this additional information, depending on the pulser number, one can now choose one or more columns of this s-parameter matrix.

The system description, at the time of its creation, requires to input information about the s-parameters of the devices that constitute the system. The inventors of the present invention propose a system that may modify that aspect wherein that information is not required at the time of the creation of the description, but only needed when one wants the output s-parameters of the system. This modified system description is referred to as symbolic sub-circuit as it is a symbolic representation of each circuit in the measurement condition. Now one does not need to know the details about the equations, which may change if the circuit changes. Each time one needs to create the circuit, supply the s-parameters of the devices that constitute the system and obtain the system s-parameters. Although the circuit shown in FIG. 3 is fairly simple and remains the same for all the measurement conditions, requiring to figure out the equations only once, the use of symbolic subcircuits makes it easier to obtain system s-parameters if one were to impose any additional criteria on the system. For example one may choose a very specific form of fixture for each measurement condition. To use this additional information for each measurement condition would require a careful re-examination of equations (19) and (22). Instead one can now input the symbolic sub-circuits for each measurement condition to the non-linear algorithm. All the known s-parameters are supplied to the symbolic sub-circuits. For each iteration, the non-linear algorithm now inputs the guess S for the DUT s-parameters to obtain $f_m(S)$. In order to obtain the partial derivative with respect to $S_{ij}$, one may input the guess $S+\epsilon \cdot e_i \cdot e_j^T$, for small $\epsilon$ and obtain the system s-parameters $f_m(S+\epsilon)$. The partial derivative can now be computed numerically without taking the limits in the equation (20).

Approximate Solution: As mentioned above the two conditions for a linear solution to exist are:

when the number of samplers is greater than or equal to the number of DUT ports and the number of measurement conditions is greater than or equal to the number of DUT ports, and when the terminations are ideal and the fixture switch isolation is ideal, i.e. if k is the fixture port number to which a DUT port is connected and that DUT port is terminated by the known termination, then the k-th row and k-th column of the fixture matrix should be all zeros.

For the case when the number of samplers is less than the number of DUT ports and the switch terminations may or may not be ideal and the fixture switch isolation may or may not be ideal, the inventors of the present invention have a developed a method to calculate an approximate answer for the DUT s-parameters. The answer would be close to the actual solution if the terminations are close to reference impedance and if the fixture switches are isolated from one another, i.e. if k is the fixture port number to which a DUT port is connected and that DUT port is terminated by the known termination, then the approximate solution is close to the actual solution if the k-th row and the k-th column of the fixture matrix is close to zero.

In order to calculate the approximate solution, first the symbolic sub-circuits are created for each measurement condition. This array of symbolic sub-circuits are then grouped together so that the symbolic sub-circuits for which the DUT ports that are connected to the system ports are the same. For example if there are three DUT ports and two samplers and one pulser, then the grouping is shown in FIG. 9. Here column one [21] is the group number. The symbolic sub-circuits that have the DUT port connected to pulser listed in column two [22] and the DUT ports connected to the system ports in column three [23] form a part of the group. The indices of the approximate s-parameter results are shown in column four [24]. For example, when the symbolic sub-circuits of group one are used to obtain approximate solution using linear method, the result is the DUT s-parameters corresponding to the indices shown in [24], i.e. the solution will consist of $S_{11}$, $S_{21}$, $S_{12}$, and $S_{22}$.

As can be seen in FIG. 9, $S_{11}$, $S_{22}$ and $S_{33}$ are common in two groups. Both these solutions are averaged together to get one value. These approximate solutions are possible for any number of DUT ports, one or more pulsers and two or more samplers. One can also use the approximate solution as an initial guess for the non-linear algorithm and thereby increasing the speed of convergence.

Once the DUT s-parameters are calculated, it can be verified if the DUT corresponds to a causal and passive device. If desired, one can enforce passivity or causality after the DUT s-parameters have been calculated. The following sections below will describe a method of enforcing passivity and causality in accordance with the present invention.

Enforcing Reciprocity while using non-linear solver: The non-linear algorithm remains the same except that the number of unknowns for a d-port reciprocal DUT are now $$\frac{d \cdot (d+1)}{2}$$

instead of $d^2$, and the partial derivatives in equation (22) are modified to $$\therefore \frac{\partial f_m(S)}{\partial S_{ii}} = F_{m21} \cdot [S \cdot (I + F_{m31} \cdot S)^{-1} \cdot F_{m31} - I] \cdot e_i \cdot e_j^T \cdot A_{DUTm}, \quad (23)$$

for the derivative with respect to the diagonal elements in S and $$\therefore \frac{\partial f_m(S)}{\partial S_{ij}} = F_{m21} \cdot [S \cdot (I + F_{m31} \cdot S)^{-1} \cdot F_{m31} - I] \cdot e_i \cdot e_j^T \cdot A_{DUTm} + \quad (24)$$
$$F_{m21} \cdot [S \cdot (I + F_{m31} \cdot S)^{-1} \cdot F_{m31} - I] \cdot e_i \cdot e_j^T \cdot A_{DUTm},$$

for the case when i<j. Since $S_{ij}=S_{ji}$, the upper triangular part of S is not a part of the unknown and the case j>i is not considered.

Passivity Enforcement: A device is passive if the energy in reflected waves is always less than or equal to the energy in the incident waves. This in turn implies that a passive device with s-parameter matrix S will satisfy:

$$\|S\|_2 \leq 1,$$

where $\|.\|_2$ is the induced two norm of a matrix. To enforce passivity, for each frequency the following steps are preferably performed:
1. Is $\|S\|_2 \leq 1$? If yes then continue checking for next frequency else go to next step.
2. Let $S = U\Sigma V^H$ be the singular value decomposition (SVD) of S. Since the norm violates the passivity criteria, one or more diagonal entries of [Y]Σ are greater than 1, i.e. $\Sigma k,k = 1 + |\delta K|$ for $k \in \{1, 2, \ldots, K\}$, $K \leq$ DUT ports, and $|\delta K| > 0$.
3. Let $(\Delta\Sigma)$ be a diagonal matrix of order n=DUT ports, with the diagonal equal to $(|\delta_1|, |\delta_2|, \ldots, |\delta_k|, 0, \ldots, 0)$. Now form the matrix $(\Delta S)$ so that $(\Delta S) = U(\Delta\Sigma)V^H$.
4. Now $\|S - \Delta S\|_2 = 1$. Thus the perturbed matrix satisfies the passivity criteria.

Causality Enforcement: Causality enforcement on a set of s-parameters is performed using an inverse DFT followed by impulse response length limits, followed by a DFT. Some special care must be taken to avoid pre-shoot and pre-ringing due to samples not landing precisely on a sample point. To understand this, consider a perfect delta function (i.e. impulse response is 1 followed by all zeros), but whose impulse is shifted by a fraction of a sample—the impulse response of such a function will exhibit a $$\frac{\sin(x)}{x}$$

type of impulse response with potentially a lot of pre and post ringing in the response. It would be grossly incorrect to chop off the pre-ring to make a causality enforcement. Therefore, to handle this, a best fractional sample is determined to first advance the frequency response prior to the inverse DFT to make the pre-shoot (due only to the aforementioned effect) as small as possible.

The procedure is explained in the below given steps:
The fast method simply calculates the phase to advance by which makes the Nyquist point real.

$$\phi = \text{Angle}\left(\frac{H(\text{Nyquist})}{H(0)}\right),$$

where Angle(.) is a function that takes the angle of a complex number, H(.) is the frequency response on which the causality is enforced, H(Nyquist) is the frequency response evaluated at Nyquist frequency, and H(0) is the frequency response evaluated at zero Hz. If $\phi<0$, we add multiples of $2\pi$ until $\phi \geq 0$.

The fractional sample is then defined as $$\text{Fractional Sample} = \frac{\phi}{\pi}$$

The second method slides the signal over various sample phases and picks the best one using the criteria that the impulse response limited and causal impulse response produces the most similar frequency response. The second method is obviously much slower.

$$\text{Fractional Sample} = \frac{i}{N},$$

where N is the number of iterations and i=1 . . . N.

Given the fractional sample value coming from either of the two methods, the frequency response is adjusted for the fractional sample $$H_{Newn} = H_n \cdot \exp\left(\frac{j\pi n}{N} \cdot \text{Fractional Sample}\right),$$

where N is the number of frequency points, n=0, ... N−1 and $H_n$ is the frequency response evaluated at $$\omega = \frac{2\pi n}{N}.$$

The IDFT of the above frequency response is taken to give the impulse response, which is then truncated to give a causal impulse response. DFT of this truncated impulse response is taken, $H_{trunc}$=DFT (truncated impulse response) and again adjusted back by the (−fractional sample) to bring it back to original delay.

$$H_{final} = H_{trunc} \cdot \exp(\frac{-j\pi n}{N} \cdot Fractional\ Sample).$$

Figure 7:
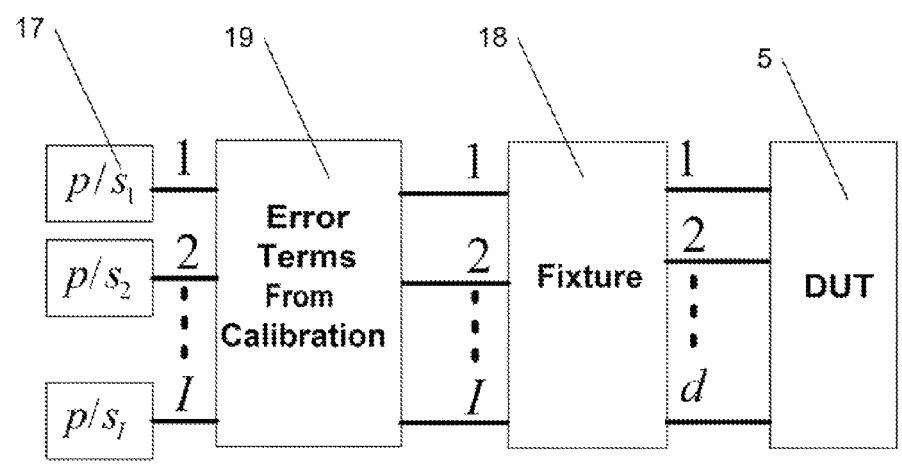
FIG. 7 is a modified block diagram of FIG. 3, that uses error terms from calibration to account for the systematic errors due to non-ideal pulsers, samplers and the connections to the fixture in accordance with an embodiment of the invention.
Figure 8:
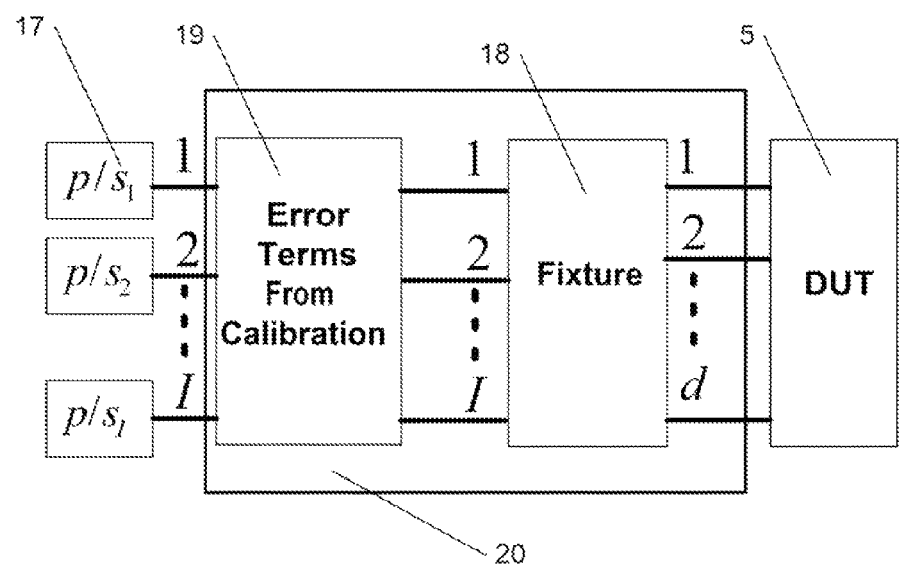
FIG. 8 shows an equivalence between FIG. 3 and FIG. 7 in accordance with an embodiment of the invention.

Calibration and Error Terms: As noted above, the inventors of the present invention have determined that removing the ideal conditions proposed above, and thus implementing a calibration step, does not result in a change to the algorithm described above. Rather, such calibration results in a change to the fixture s-parameter matrix. After calibration in accordance with the system and method of the invention, the system may be modified as shown in FIG. 7. The "Error Terms from Calibration" [19] block in the FIG. 7 is calculated using the measurements made during calibration procedure. The most commonly used twelve-term error model described in "Agilent AN 1287-3 Applying Error Correction to Network Analyzer Measurements-Application Note" is preferably employed. These error terms account for the systematic errors due to the non-idealities in pulsers and samplers, making the pulsers and samplers [17] blocks in the FIG. 7 appear as ideal. The above described system can then be replaced by the new system shown in FIG. 8. As can be seen from FIG. 8, the difference between the ideal system and the system after calibration is that the fixture s-parameters have changed. The new fixture [20] is a cascade of the error terms from calibration and the actual fixture. Thus all the algorithms described above hold true even after the calibration stage is implemented in accordance with the invention.

Therefore, in accordance with the invention, a system and method are provided that allow for the calibration of a system used to determine s-parameters of a DUT in an automatic manner. Such calibration may also be implemented employing a single pulser. Once performed, such calibration presents a switching device in accordance with the invention as an ideal device to the DUT, and is thus able to determine s-parameters thereof employing the mathematical calculations as described above. Through the user of such method and system in accordance with the present invention, it is possible to perform automatic calibration of an s-parameter measurement system, employing a single pulser, and then perform automatic s-parameter measurements of a DUT employing such calibrated system.

It will thus be seen that the objects set forth above, among those made apparent from the preceding description, are efficiently attained and, since certain changes may be made in the above construction(s) without departing from the spirit and scope of the invention, it is intended that all matter contained in the above description or shown in the accompanying drawing(s) shall be interpreted as illustrative and not in a limiting sense.

It is also to be understood that this description is intended to cover all of the generic and specific features of the invention herein described and all statements of the scope of the invention which, as a matter of language, might be said to fall there between.

What is claimed:

1. A method for converting a step-like waveform acquired at a driven port by a network analyzer and a step-like waveform acquired at a measurement port by the network analyzer different from the driven port to a frequency response representative of a raw s-parameter measurement from the driven port to the measurement port by a computer processor, comprising the steps of:
    computing a first difference of the step-like waveform acquired at the driven port;
    computing a transmission waveform as a first difference of the step-like waveform acquired at the measurement port;
    computing an incident waveform by extracting an incident portion of the first difference of the step-like waveform acquired at the driven port;
    computing a frequency domain waveform of the incident waveform;
    computing a frequency domain waveform of the transmission waveform; and
    computing a frequency response as a ratio of the frequency domain waveform of the transmission waveform and the frequency domain waveform of the incident waveform at each of a plurality of frequencies.

2. The method of claim 1, wherein the computing of the frequency domain waveform of the incident waveform and the computing of the frequency domain waveform of the transmission waveform is accomplished in accordance with the chirp z-transform.

3. The method of claim 1 wherein the step-like waveform acquired at the measurement port is denoised before the step of computing a frequency domain waveform of the first difference of the step-like waveform acquired at the measurement port.

4. The method of claim 1, wherein the step-like waveform acquired at the driven port is denoised before the step of computing a frequency domain waveform of the first difference of the step-like waveform acquired at the driven port.

5. The method of claim 1, wherein the step of extracting an incident portion of the first difference of the step-like waveform acquired at the driven port further comprises the steps of:
    detecting an edge time location of an edge of the step-like waveform;
    subtracting a predetermined beginning time from the edge time location to form a beginning gate time;
    adding a predetermined incident duration time to the edge time location to form an ending gate time; and
    retaining a portion of the first difference of the step-like waveform acquired at the driven port between the beginning gate time and the ending gate time.

6. A method for converting by a computer processor running a computer program stored to a non-transitory computer storage medium a step-like waveform acquired at a driven port of a Device Under Test (DUT) by a network analyzer to a frequency response representative of a raw s-parameter measurement from the driven port of the DUT to the driven port of the DUT, comprising the steps of:
    computing by the network analyzer a first difference of the step-like waveform acquired at the driven port of the DUT;

computing by the network analyzer an incident waveform by extracting an incident portion of the first difference of the step-like waveform acquired at the driven port of the DUT;

computing by the network analyzer a frequency domain waveform of the incident waveform;

computing by the network analyzer a reflect waveform by removing the incident portion of the first difference of the step-like waveform acquired at the driven port of the DUT;

computing by the network analyzer a frequency domain waveform of the reflect waveform; and computing by the network analyzer a frequency response as a ratio of the frequency domain waveform of the reflect waveform and the frequency domain waveform of the incident waveform at each of a plurality of frequencies.

7. The method of claim 6, wherein the computing of the frequency domain waveform of the incident portion of the first difference of the step-like waveform acquired at the driven port and the computing of the frequency domain waveform of the first difference of the step-like waveform acquired at the measurement port is accomplished in accordance with the chirp z-transform.

8. The method of claim 6, wherein the step-like waveform acquired at the driven port is denoised before the step of computing a frequency domain waveform of the first difference of the step-like waveform acquired at the driven port.

9. The method of claim 6, wherein the step of extracting an incident portion of the first difference of the step-like waveform acquired at the driven port further comprises the steps of:

detecting an edge time location of an edge of the step-like waveform;

subtracting a predetermined beginning time from the edge time location to form a beginning gate time;

adding a predetermined incident duration time to the edge time location to form an ending gate time; and retaining a portion of the first difference of the step-like waveform acquired at the driven port between the beginning gate time and the ending gate time.

10. A method for measuring s-parameters of a device under test, comprising the steps of:

acquiring one or more measurements at a first time by a network analyzer for measuring the s-parameters of the device under test;

determining a first set of one or more user-defined parameters used by the network analyzer for calculating the s-parameters of the device under test;

calculating a first set of s-parameters of the device under test by the network analyzer in accordance with one or more of the first set of the determined one or more user-defined parameters and the one or more acquired measurements;

determining a second set of one or more user-defined parameters used by the network analyzer for calculating the s-parameters of the device under test; and calculating a second set of s-parameters of the device under test by the network analyzer in accordance with one or more of the second set of the determined one or more user-defined parameters and the one or more acquired measurements;

wherein the calculation of the second set of s-parameters of the device under test in accordance with the one or more of the second set of the determined user-defined parameters by the network analyzer is performed without re-acquiring the one or more measurements by the network analyzer.

11. The method of claim 10, wherein the second set of one or more user-defined parameters is determined after the acquiring one or more measurements by the network analyzer.

12. The method of claim 10, wherein the acquired measurements are step-like waveforms.

13. The method of claim 12, further comprising the steps of:

storing the step-like waveforms; and reloading the step-like waveforms to the network analyzer; wherein the network analyzer is able to calculate the s-parameters of the device under test in accordance with one or more of the second set of the determined one or more user-defined parameters and the one or more reloaded acquired measurements.

14. The method of claim 13, wherein upon reloading the step-like waveforms, the network analyzer is placed in a state as if it had acquired the step-like waveforms.

15. The method of claim 14, wherein the step-like waveforms are cleared from memory of the network analyzer before reloading of the step-like waveforms.

16. The method of claim 10, wherein the first set of user-defined parameters and the second set of user-defined parameters differ in at least one or more specified frequencies of the first and second sets of s-parameters.

17. The method of claim 10, wherein the first set of user-defined parameters and the second set of user-defined parameters differ in at least a number of specified frequencies of the first and second sets of s-parameters.

18. The method of claim 10, wherein the step of acquiring one or more measurements at the first time by the network analyzer for measuring the first set of s-parameters of the device under test includes measurements for calibrating the network analyzer.

19. The method of claim 18, wherein a calibration of the network analyzer is performed after the step of determining the second set of one or more user-defined parameters used by the network analyzer for calculating the second set of s-parameters of the device under test.

20. A method for calculating s-parameters in a device under test, comprising the steps of:

acquiring one or more measurements by a network analyzer for measuring the s-parameters of the device under test; and calculating the causal s-parameters of the device under test by the network analyzer in accordance with the steps of:

determining a fractional delay;

delaying each of a plurality of s-parameters in accordance with the determined fractional delay;

computing an inverse Fourier transform of each of the plurality of fractionally delayed s-parameters;

extracting a portion of the inverse Fourier transform of each of the plurality of fractionally delayed s-parameters that appear between a plurality of predetermined times; and computing a Fourier transform of each of the extracted portions to generate causal s-parameters.

* * * * *

UNITED STATES PATENT AND TRADEMARK OFFICE
CERTIFICATE OF CORRECTION

PATENT NO.       : 8,706,433 B2
APPLICATION NO.  : 13/017394
DATED            : April 22, 2014
INVENTOR(S)      : Peter J. Pupalaikis et al.

It is certified that error appears in the above-identified patent and that said Letters Patent is hereby corrected as shown below:

In the Specification

Column 9,
Line 48, Equation (5) should appear as follows:
$$A_{SYS_m} = e_m;$$
Line 52, Equation (7) should appear as follows:
$$B_{SYS_m} = -F_{m21} \cdot S \cdot A_{DUT_m} - F_{m24} \cdot A_{SYS_m};$$

Column 11,
Line 14, "where $B_{vec}$ is the "vectorized" $B_{DUT}^T$ in equation" should read -- where $B_{vec}$ is "vectorized" $B_{DUT}^T$ in equation --

Line 18, "Here, "vectorized" $B_{DUT}^T$ means" should read -- Here, "vectorized" $B_{DUT}^T$ means --

Line 19, "of the matrix $B_{DUT}^T$, and" should read -- of the matrix $B_{DUT}^T$, and --

Line 30, "where $B_{DUT \cdot k}^T$ is the k–th column of $B_{DUT}^T S_{vec}$ is formed" should read -- where $B_{DUT \cdot k}^T$ is the k–th column of $B_{DUT}^T \cdot S_{vec}$ is formed --

Column 12,
Line 53, Equation should appear as follows:
$$f(S) = -F_{21} \cdot S \cdot (I + F_{31} \cdot S)^{-1} \cdot (-F_{34} \cdot A_{SYS}) - F_{24} \cdot A_{SYS}.$$
Line 60, Equation should appear as follows:
$$\frac{\partial f(S)}{\partial S_{ij}} = \lim_{\epsilon \to 0} \frac{f(S + \epsilon \cdot e_i \cdot e_j^T) - f(S)}{\epsilon},$$
Line 67, Equation should appear as follows:
$$f(S + \epsilon \cdot e_i \cdot e_j^T) = -F_{21} \cdot (S + \epsilon \cdot e_i \cdot e_j^T) \cdot (I + F_{31} \cdot (S + \epsilon \cdot e_i \cdot e_j^T))^{-1} \cdot (-F_{34} \cdot A_{SYS}) - F_{24} \cdot A_{SYS}$$

Signed and Sealed this
Thirtieth Day of September, 2014

Michelle K. Lee
*Deputy Director of the United States Patent and Trademark Office*